United States Patent [19]

Jiang

[11] Patent Number: 4,535,427
[45] Date of Patent: Aug. 13, 1985

[54] CONTROL OF SERIAL MEMORY

[75] Inventor: Ching-Lin Jiang, Dallas, Tex.

[73] Assignee: Mostek Corporation, Carrollton, Tex.

[21] Appl. No.: 447,348

[22] Filed: Dec. 6, 1982

[51] Int. Cl.³ .............................................. G11C 11/40
[52] U.S. Cl. .................................... 365/205; 365/190
[58] Field of Search ................ 365/190, 205, 189, 230

[56] References Cited

U.S. PATENT DOCUMENTS 3,772,658 11/1973 Sarlo .................................... 365/189
4,024,512 5/1977 Amelio et al. ...................... 365/183

Primary Examiner—Terrell W. Fears
Attorney, Agent, or Firm—Eric W. Petraske

[57] ABSTRACT

A FIFO memory chip includes read and write pointers in the form of an X and a Y shift register carrying a pair of pointer bits that point to a memory cell in a rectangular cell array.

6 Claims, 6 Drawing Figures

CONTROL OF SERIAL MEMORY

DESCRIPTION

1. Technical Field

The field of the invention is that of integrated circuit memories, in particular, memories that are accessed sequentially.

2. Background Art

It is known in the art of computer design to use first-in/first-out (FIFO) memories for communication between two processors that operate asynchronously. The use of FIFO and LIFO memories for other purposes is also known.

Prior art methods of building serial memories fall into two groups. The first group employs a serial memory cell string with serial control and addressing logic. A problem with this approach has been that serial memory cell size is too large to build large size memories. A second problem is that the latency of this configuration is rather long. A second approach is to use a RAM memory array with binary address generation and decoding logic. A problem with this approach has been that the overhead circuitry of counters, decoders, and address lines requires costly silicon area and complex layout resulting in a bulky circuit and in a slow access time.

DISCLOSURE OF INVENTION

The invention relates to a serial memory having an array of memory cells and a set of shift register pointers to cells within the array.

A feature of the invention is a FIFO memory having a small area and fast response time.

Another feature of the invention is that of a memory with dual port cells that are simultaneously accessible by two processors.

BEST MODE FOR CARRYING OUT THE INVENTION

As more and more computer systems that include a number of processors that operate independently are designed the need to communicate effectively and synchronize the operation of these independent processors increases. Examples of this problem are communication between a computer and its peripherals or distributed networks of small computers. In these and other cases, the two subsystems operate at independent rates yet must communicate with one another.

Methods known in the art to interconnect two independent processors include synchronization by using a common clock, interrupts, handshakes or FIFO's; buffering including RAMS, registers and FIFO's and data transferring including program loop, block I/O, FIFO and direct memory access. In all these methods except FIFO, some kind of bus conflict arbitration mechanism is necessary due to the single port nature of the memory cell involved, resulting in complex and expensive hardware and software implementations as well as low system throughput rates.

In the case of a FIFO used as a communication link between two independent processors, it is known in the art to use shift registers as basic memory elements together with corresponding transfer logic; or to use conventional RAM's as basic memory elements with overhead control circuitry for read-write arbitration and handshake logic.

Figure 1:
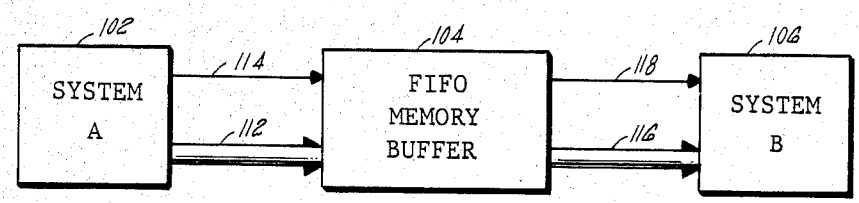
FIG. 1 illustrates a system employing an embodiment of the invention.

FIG. 1 illustrates a simple system including processor A, indicated as 102 in the diagram, processor B, indicated as 106 in the diagram communicating through a FIFO memory buffer indicated as 104. Communication is shown as unidirectional going along bus 112 from system 102 to buffer 104 and then along bus 116 from buffer 104 to system 106. Control signals travel bidirectionally across lines 114 and 118 to and from the systems and the buffer. It would, of course, be straightforward to include two buffers, one in each direction, if the system requires bidirectional communication. It would also be straightforward to modify the subject invention to provide a bidirectional FIFO buffer.

Figure 2:
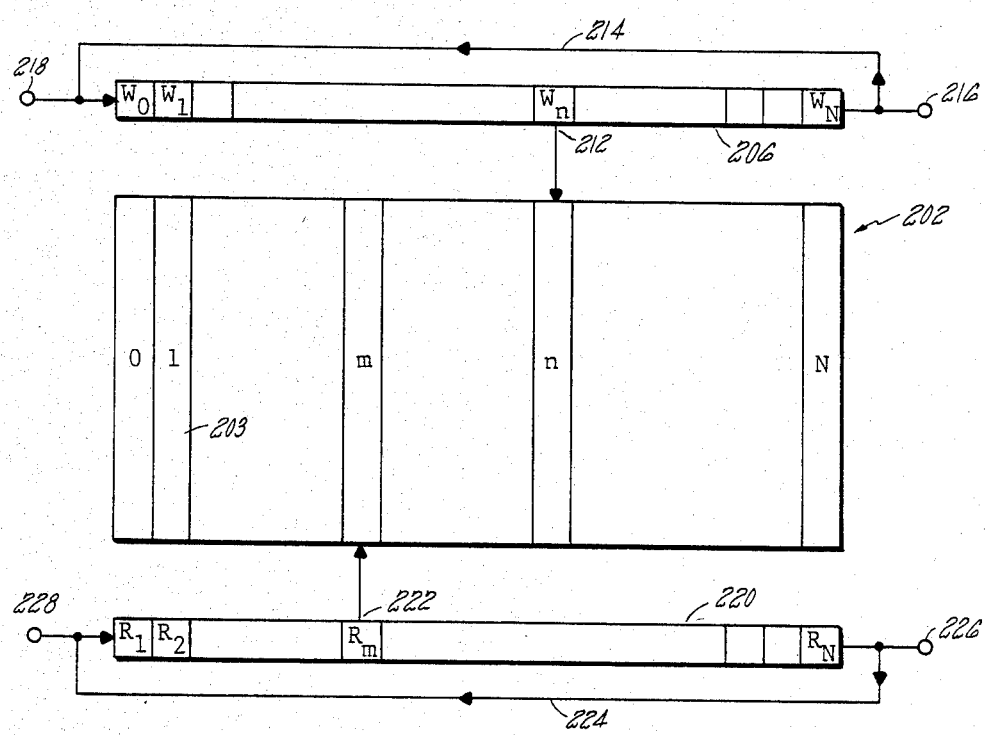
FIG. 2 illustrates a logical diagram of an embodiment of the invention.

FIG. 2 illustrates a logical diagram of a FIFO employing a serial array 202 of memory storage cells one of which is indicated by the number 203. The width of each cell may of course vary from a single bit upwards to any desired length. An illustrative embodiment includes a cell width 9-bits wide to carry a single byte plus a parity bit. A portion of the control circuitry is illustrated showing shift register 206 which contains a single binary one pointer bit shown as occupying cell 212 of the shift register, which bit is shifted along under control of overhead circuitry not shown in this diagram, to indicate the cell next to be written into. In this case, the FIFO memory is partly full and the portion up to cell n−1 has been written into already. When the Nth cell has been written into, the pointer bit is shifted along line 214 back to the first cell.

Sometime after the first bit has been written into array 202, the second processor begins to read the information. It starts, of course, at cell 0 and continues reading at its natural speed until it reads everything that the first processor has written. In this figure, the Mth bit is next to be read and is pointed to by cell 222. As in the case of the write shift register, the pointer bit is carried back to cell 0 along line 224. It is not necessary, of course, that the pointer bits mark the cell next to be written into, though that is convenient. Other pointer schemes such as marking the cell just written into, will be evident to those skilled in the art.

Conventional overhead circuitry that is not shown in this diagram for simplicity, sets flags to indicate that the FIFO is empty or full in order to perform the known function of blocking a write into a full FIFO and blocking a read from an empty FIFO. Since the register has ring structure and loops back on itself, the flags can mean either that all cells have been written into and none have been read, or that the second processor has read everything that has been written, so that there is nothing more to read. A simple method of implementing these flags is to include a counter responsive to each read and write signal from a processor and a comparator. When nothing has been written, the memory is empty. When the read and the write counters are equal, i.e., when the second processor has read all that is in the memory, the memory is also regarded as empty. When every cell has been written into and none have been read since the last write, the memory is full.

An advantageous feature of this invention is the use of a dual port memory cell, which will be described below, so that it is possible to read and write independently from the separate processors. Each processor has access to a separate set of word and bit lines that penetrate the individual cells within the array. With such an independent cell, it is possible to read and write simultaneously in the same cell, which will happen frequently when the reading processor is faster than the writing processor. This problem can be handled in any of several ways. If the reading processor responds to the cell voltage in such a manner that the final voltage in the cell determines the output, it may be possible simply to permit simultaneous reading while a write operation is going on. If the circuits involved take time to stabilize or if this simultaneous read operation is unreliable, a simple approach is to inhibit read for a certain time after the write operation. One inhibits simultaneous reads only in the same cell, i.e., only when the two pointers are the same, so that it is possible to read the N-2th cell at the same time the Nth cell is being written into.

It would be straightforward to those skilled in the art to modify the logic diagram shown in FIG. 2 to form a bidirectional FIFO buffer. One method would be to let different processors write in different portions. Whether such a bidirectional buffer is simpler to manufacture than the use of two unidirectional buffers is a matter of system design.

Another advantage of the invention as illustrated in FIG. 2 is that it is readily expandable to an array of several FIFO chips. If the first chip of N cells has been completely written into, then a shift signal appearing on line 214 also appears on terminal 216 which is connected to another identical chip. Conventional hardware suppresses write operations on the first chip and enables write operations on the second chip. The total number of memory cells can thus be expanded without affecting the pin out arrangement or significantly affecting the system.

A particular embodiment incorporates a 512 cell array, each cell storing 9-bits to accommodate a byte plus a parity bit. The chip is encased in a standard 28 pin package having connections for power supply voltage, ground, 18 pins for input and output buses, 2 flags for empty and full, 2 expansion signals, input and output, write and read enable pins, a reset pin and a first load/retransmit pin that carries a retransmit signal (used in the single chip configuration to retransmit when an error has been detected), or that flags the first chip in a multi-chip ring. A particular advantage of this arrangement is that the pin out is independent of the depth of the memory.

Figure 3:
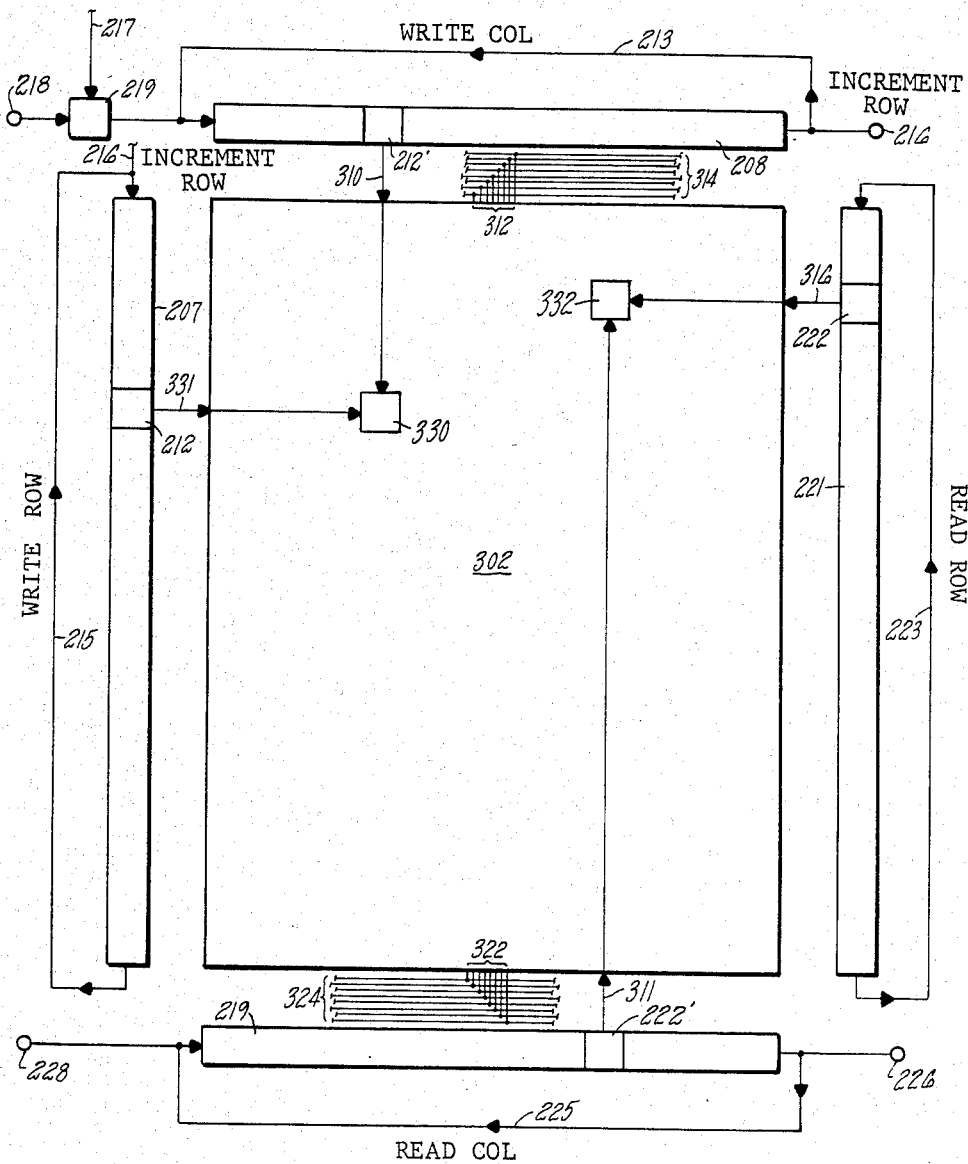
FIG. 3 illustrates in partially pictorial, partially schematic form the embodiment of FIG. 2.

FIG. 3 illustrates, in partially pictorial, partially schematic form a memory cell array that embodies the logical diagram shown in FIG. 2. In it, the memory cells are stored in a rectangular array which is configured the same as a RAM memory matrix. The individual cells within the memory have two sets of independent word and bit lines so that write and read may be operated independently. The one dimensional cell array 202 of FIG. 2 has been changed to the two dimensional array 302. In this array, the individual cells contain a byte, not a single bit. Those skilled in the art will readily be able to adapt this invention to a cell containing any number of bits. The write shift register 206 of FIG. 2 has been changed to a pair of X and Y shift registers that point to a single cell. In the case illustrated, cell 330 is next to be written into and is pointed to by pointer bit 212' in the X dimension and pointer bit 212 in the Y dimension. In operation, the bits are written into from the upper left-hand corner on the top row and then back to the left-most bit of the second row etc. Thus, for cell 1, there is a pointer bit in the first cell of both the X and Y registers. The X shift register 208 is incremented until it reaches the end and looped back. The Y shift register 207 is incremented once each time the X register has cycled. The pointer bit, therefore, is looped back along line 213 for the X pointer and along line 215 for the Y pointer, as in the embodiment of FIG. 2. The output 216 of the X pointer labeled increment row serves as the input 216 to shift register 207 to increment the Y pointer to move it to a new row. The shift signal, referred to as write enable, enters on terminal 218 and may be blocked by gate 219, which is responsive to the expansion input signal along line 217. In the case where the chip has been filled and the next write needs to take place in the next chip in the chain of memory chips, write is inhibited on this chip in response to a signal sent along line 217.

The read operation, of course, follows along behind the write operation. In FIG. 3, cell 332 is next to be read and is flagged by pointer bits 222 in the Y shift register 221 and by pointer bit 222' in the X shift register 219. As in the case of the write shift registers, wires 223 and 225 loop the pointer bit back on itself. Incrementing of the Y pointer bit every time the X register has cycled is accomplished in the same manner as described above with the write shift registers. Features of this embodiment that will be described below include enable line 310 extending from cell 212' containing the pointer bit and bus 314 and data lines 312 which connect to the bus. A similar read enable line 311 and read bus 324 and the read data lines 322 are shown on the X read register.

Figure 4:
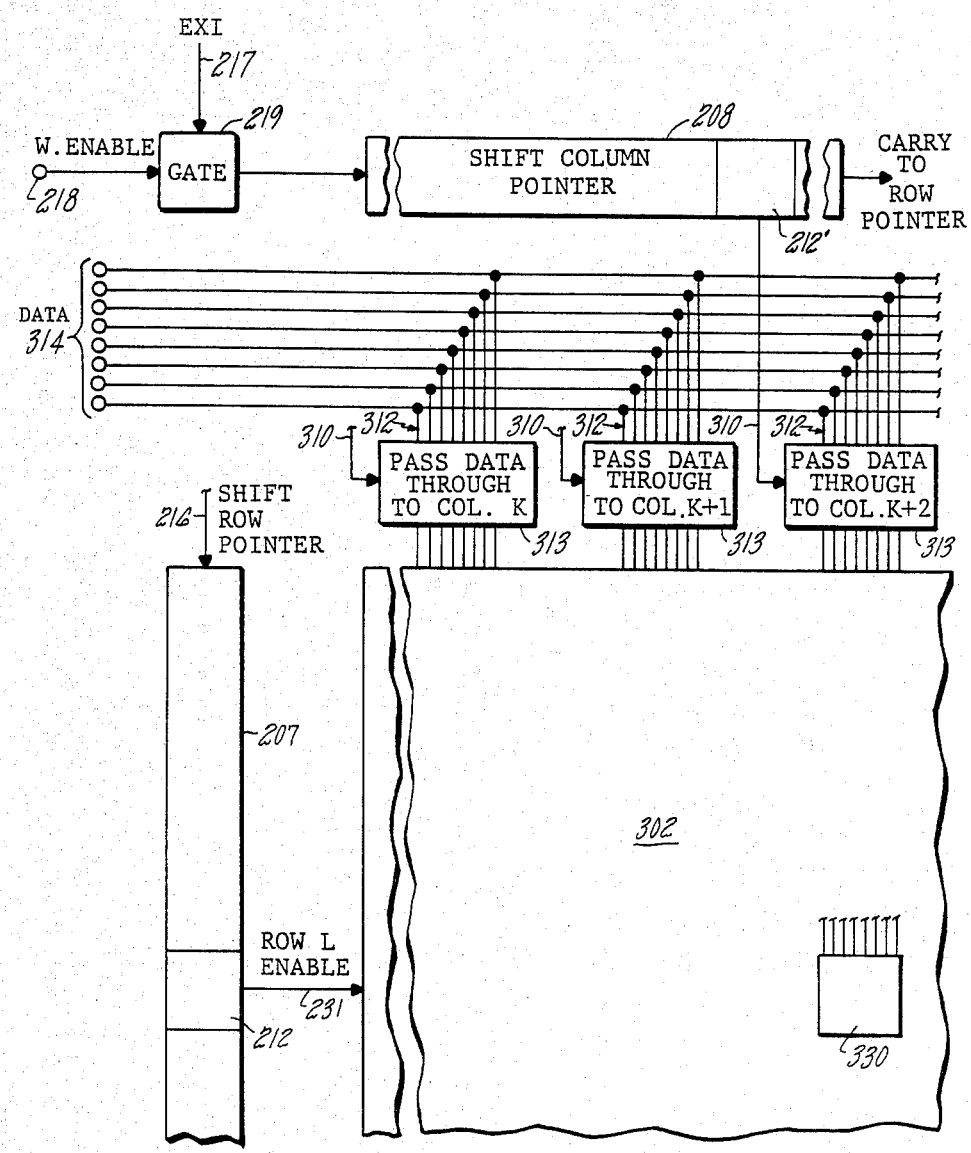
FIG. 4 illustrates a detail of the embodiment of FIG. 3.

FIG. 4 illustrates these details in which terminal 218 carrying the write enable signal enters gate 219 which also receives a signal along line 217. Cell 212' sends a signal along line 310 which enters block 313 which serves as a gate to block the passage of data from the bus 312 into the array. This gate, which may be implemented in any of a number of conventional ways known to those skilled in the art, serves to connect the data on bus 314 with the appropriate bit lines of the memory cells when the pointer in the shift register enables the passage of the data. A simple implementation would include AND gates and inverters to generate the bit line signal and its complement to write in a standard static RAM cell as will be described below. This figure illustrates an embodiment in which there is a read bus and a write bus sending data into a cell in parallel, the cell containing an entire byte of data. Those skilled in the art will readily be able to modify this illustration to accommodate a cell containing a single bit, or a word having a length greater than one byte. Similarly, the data need not be transmitted in parallel but may, if the system requires it, be transmitted serially with suitable overhead hardware to feed the incoming data into the appropriate memory cells. Within the individual flip-flop (or bit memory cells) that form byte-wide cell 330, there are the bit lines 312 and a common row line 331. Row line 331 is controlled by conventional overhead circuitry in response to pointer bit 212 of Y register 207.

Figure 5:
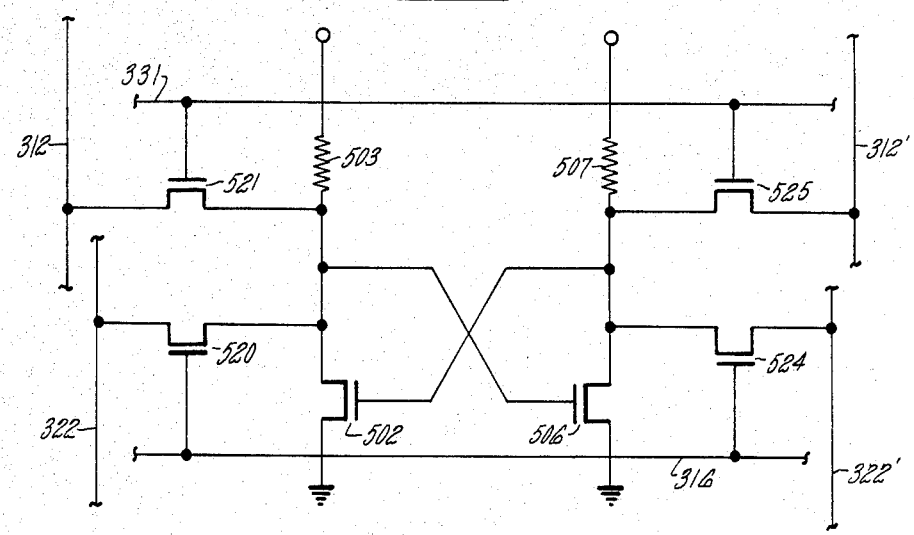
FIG. 5 illustrates a dual port NMOS memory cell.

FIG. 5 illustrates a bit memory cell suitable for use in this subject invention. Line 331 is the enable line from the Y shift register, as shown in FIG. 3. It is the word line in the cell array, enabling all cells in that row. Lines 312 and 312' are the data and inverse data lines coming off bus 314 and down the byte-wide column, that are enabled by enable line 310 corresponding to the pointer bit in cell 212' of FIG. 3. Data is then written into the flip-flop formed by transistors 502 and 506, as is conventional in any static RAM cell. An additional set of lines comprising row line 316 and bit lines 322 and 322' form the counterpart of the write lines and are used to read out data from the same flip-flop. Thus, as was described above, the flip-flop has two ports and may be read or written into independently. The cell shown, when implemented in NMOS has dimensions of 50×40 micrometers using a three micrometer single polysilicon process.

Figure 6:
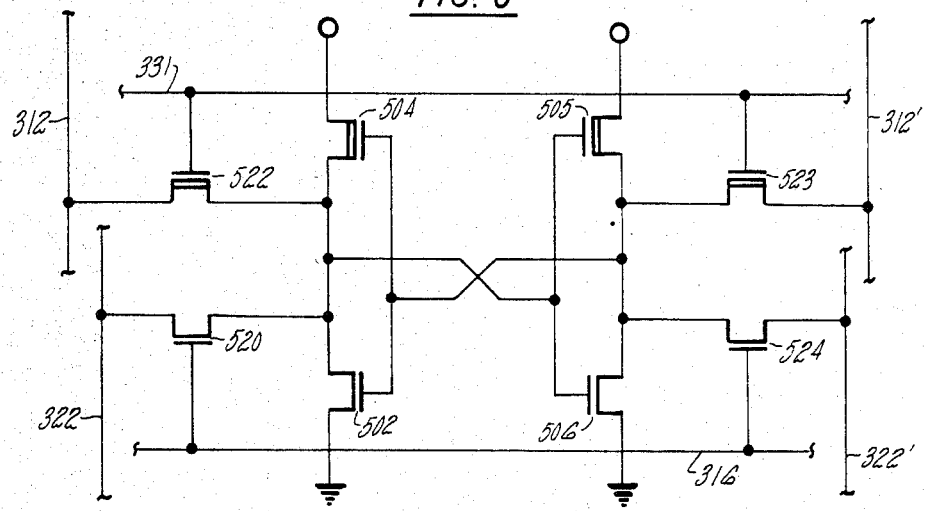
FIG. 6 illustrates a dual port CMOS memory cell.

FIG. 6 illustrates a dual port CMOS cell, in which resistors 503 and 507 are replaced by transistors 504 and 505, respectively. Transistors 522, 523, 504 and 505 are p-type; and transistors 520, 506 and 524 are n-type. The advantage of using p-type pass transistors, in addition to the p-type transistors 504 and 505, is a reduction in cell size.

The present invention is not limited to FIFO memories, and will also work with LIFO memories or other types of serial memory.

I claim:

1. An integrated circuit serial memory comprising:
   an array of memory cell elements;
   writing means for writing data sequentially into said array;
   reading means for reading data sequentialy out of said array; and
   control means for setting flags indicating memory-full and memory-empty states;
   characterized in that:
   said array comprises a two dimensional array of non-shifting memory cells, having an X and a Y dimension;
   said writing means includes a first write shift register carrying a first write pointer bit along the X dimension of said array and a second write shift register carrying a second write pointer bit along the Y dimension of the array, which first and second write shift register pointer bits point in the X and Y dimensions to a write cell; and
   said reading means includes a first read shift register carrying a first read pointer bit along the X dimension of said array and a second read shift register carrying a second read pointer bit along the Y dimesion of said array, which first and second read shift register pointer bits point in the X and Y dimensions to a read cell.

2. An integrated circuit serial memory according to claim 1, further characterized in that:
   said serial memory is a first-in/first-out memory, whereby said reading means reads sequentially data written by said writing means, beginning with the first to be written data.

3. An integrated circuit memory according to claim 2, further characterized in that:
   each of said memory cell elements comprises at least one bit cell for storing a data bit.

4. An integrated circuit memory according to claim 3, further characterized in that:
   said bit cell includes dual port means for independently reading data from and writing data into said bit cell.

5. An integrated circuit memory according to claim 2, further characterized in that:
   said control means includes means for communicating with other memory chips in a loop memory configuration, whereby write and read operations follow consecutively from a first chip to a second chip, and also in that;
   said control means includes means for inhibiting write operations in a full memory chip and for enabling write operations in an adjacent memory chip.

6. An integrated circuit serial memory according to claim 4, in which said dual port means includes a read control line for controlling at least one read access means for establishing a current path from at least one data line to said bit cell and a write control line for controlling at least one write access means, independent of said read access means, for establishing a current path form said at least one data line to said bit cell.

* * * * *